United States Patent
Liu et al.

(12) United States Patent (10) Patent No.: US 7,683,443 B2
Liu et al. (45) Date of Patent: Mar. 23, 2010

(54) MOS DEVICES WITH MULTI-LAYER GATE STACK

(75) Inventors: Chun-Li Liu, Mesa, AZ (US); Marius K. Orlowski, Austin, TX (US); Matthew W. Stoker, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/347,061

(22) Filed: Dec. 31, 2008

(65) Prior Publication Data

US 2009/0115001 A1    May 7, 2009

Related U.S. Application Data

(62) Division of application No. 11/343,623, filed on Jan. 30, 2006, now Pat. No. 7,510,956.

(51) Int. Cl.
    *H01L 29/76*    (2006.01)
(52) U.S. Cl. ............... 257/412; 257/413; 257/E29.255
(58) Field of Classification Search ............ 257/412, 257/413, 410, E29.128, E29.255
    See application file for complete search history.

(56) References Cited

U.S. PATENT DOCUMENTS

| | | | |
|---|---|---|---|
| 4,348,268 A | 9/1982 | Muller | |
| 5,668,394 A | 9/1997 | Lur et al. | |
| 5,796,166 A | 8/1998 | Agnello et al. | |
| 6,291,868 B1* | 9/2001 | Weimer et al. ............... 257/413 |
| 6,323,511 B1 | 11/2001 | Marsh | |
| 6,395,409 B2 | 5/2002 | Ueda et al. | |
| 6,413,687 B1 | 7/2002 | Hattori et al. | |
| 6,468,676 B1 | 10/2002 | Ueda et al. | |
| 6,835,662 B1 | 12/2004 | Erhardt et al. | |
| 6,894,353 B2 | 5/2005 | Samavedam et al. | |
| 7,109,079 B2 | 9/2006 | Schaeffer, III et al. | |
| 7,241,691 B2 | 7/2007 | Liang et al. | |
| 2003/0136998 A1 | 7/2003 | Baniecki et al. | |
| 2003/0143825 A1 | 7/2003 | Matsuo et al. | |
| 2004/0021161 A1 | 2/2004 | Agarwal | |
| 2004/0023478 A1* | 2/2004 | Samavedam et al. ......... 438/592 |
| 2004/0082166 A1 | 4/2004 | Hecht et al. | |
| 2004/0106261 A1* | 6/2004 | Huotari et al. ............... 438/287 |
| 2004/0159863 A1 | 8/2004 | Eldridge et al. | |

(Continued)

OTHER PUBLICATIONS

Misra et al., "Issues in high-k gate stack interfaces," MRS Bulletin, Mar. 2002, www.mrs.org/publications/bulletin, pp. 212-216.

(Continued)

*Primary Examiner*—Tuan N. Quach
(74) *Attorney, Agent, or Firm*—Ingrassia, Fisher & Lorenz, P.C.

(57) ABSTRACT

An embodiment of a semiconductor device includes a semiconductor substrate having a principal surface, spaced-apart source and drain regions separated by a channel region at the principal surface, and a multilayered gate structure located over the channel region. The multilayered gate structure includes a gate dielectric layer in contact with the channel region, a first conductor comprising a metal oxide overlying the gate dielectric layer, a second conductor overlying the first conductor, and an impurity migration inhibiting layer between the gate dielectric layer and the first conductor or between the first conductor and the second conductor.

16 Claims, 7 Drawing Sheets

U.S. PATENT DOCUMENTS

| | | | |
|---|---|---|---|
| 2004/0248394 | A1 | 12/2004 | Kobayashi et al. |
| 2005/0098205 | A1 | 5/2005 | Roscheisen et al. |
| 2005/0104112 | A1* | 5/2005 | Haukka et al. ............... 257/310 |
| 2006/0166424 | A1 | 7/2006 | Schaeffer, III et al. |
| 2006/0216934 | A1 | 9/2006 | Liang et al. |
| 2006/0261436 | A1* | 11/2006 | Turner et al. ................ 257/506 |

OTHER PUBLICATIONS

Anwar et al., "An XPS study of amorphous MoO3/SiO films deposited by co-evaporation," Journal of Materials Science 25 (1990) 1784-1788.

Chen et al., "Stability of Ru- and Ta-based metal gate electrodes in contact with dielectrics for Si-CMOS" University of California, Postprints, Paper 280, Year 2004.

Kattelus et al., A Batch Process for Depositing Amorphous Metallic Mo-Si-N Films, VTT Centre for Microelectronics, Tekniikantie 17, Espoo, Finland.

Kattelus et al., A Batch Process for Depositing Amorphous Metallic Mo-Si-N Films, VTT Centre for Microelectronics, Tekniikantie 17, Espoo, Finland, ,J.Mat.Sci.,May-Jul. 2003,14(5-7),427-430.

* cited by examiner

MOS DEVICES WITH MULTI-LAYER GATE STACK

CROSS REFERENCE TO RELATED APPLICATION

This application is a divisional of application Ser. No. 11/343,623, filed on Jan. 30, 2006, U.S. Pat. No. 7,510,956.

TECHNICAL FIELD

The present invention generally relates to semiconductor devices, and more particularly to field effect transistors with multi-layer gates.

BACKGROUND

There is an ongoing need for semiconductor devices, especially field effect devices whose threshold voltage and other properties can be tailored to particular applications. Accordingly, there is a need for devices having these and other desirable features and flexibility. Accordingly, it is desirable to provide an improved device structure and method that provides semiconductor devices of the desired properties. In addition, it is desirable that the changes in device structure and method of fabrication used to improve the devices be compatible with or involve little or no change in existing device manufacturing techniques. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner.

For convenience of description, field effect devices are illustrated herein by way of metal-oxide-semiconductor (MOS) devices. Such devices may be P-channel type devices referred to as PMOS devices or N-channel type devices, referred to as NMOS devices. The teachings and embodiments herein relate usefully to PMOS devices and are described herein for such structures. However, this is for convenience of illustration and not intended to be limiting and the principles taught herein also apply to NMOS devices. Thus, as used herein the terms "P-type" and "N-type" are intended to be equivalent to and include the more general terms "first conductivity type" and "second conductivity type" respectively, where "first" and "second" can refer to either P or N conductivity types. The terms "metal" and "oxide" and metal-oxide semiconductor and the abbreviation "MOS" are intended to include: for "metals" any reasonably stable conductive materials; and for "oxides" any reasonably stable insulating materials. Non-limiting examples of useful conductive materials are various metals, metal alloys, semi-metals and semiconductors. Non-limiting examples of useful insulating materials include insulating oxides, nitrides, mixtures thereof and other organic and inorganic materials that behave as dielectrics.

Figure 1:
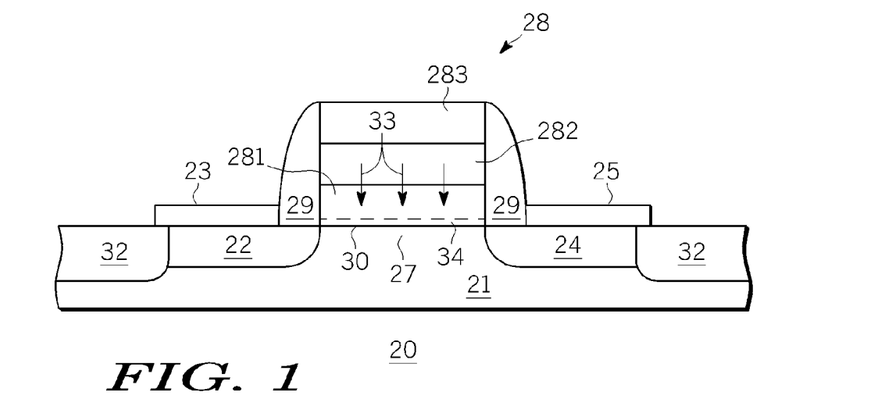
FIG. 1 is a simplified schematic cross-sectional view through a semiconductor device with a multilayered gate structure, according to an embodiment of the present invention.

FIG. 1 is a simplified schematic cross-sectional view through semiconductor device 20 with multilayered gate structure 28 according to an embodiment of the present invention. Device 20 comprises N-type semiconductor substrate 21 which is conveniently of mono-crystalline silicon. However, the terms "substrate", "semiconductor" and "semiconductor substrate" and "polycrystalline semiconductor" as used herein are intended to include any type of semiconductor material and not be limited merely to silicon. Non-limiting examples of other useful types of semiconductors are other type IV semiconductors and III-V and II-VI compounds that exhibit semiconducting properties. Semiconductor substrate 21 may be polycrystalline or mono-crystalline and may be a bulk semiconductor or a thin film semiconductor or a semiconductor-on-insulating (SOI) substrate. Any and all such arrangements are useful with the present invention. Monocrystalline silicon is convenient. P-type source region 22 with contact 23 and P-type drain region 24 with contact 25 are located in substrate 21. These may be formed by any appropriate technique, such as for example but not limited to ion implantation, thermal doping, molecular beam epitaxy, combinations thereof or other techniques well known in the art. Source region 22 and drain region 24 are separated at surface 30 by channel region 27. Multilayer gate structure 28 overlies channel region 27 and comprises, in this example, gate oxide layer 281, first conductor layer 282 and second conductor layer 283. Polycrystalline semiconductor (e.g., polycrystalline silicon) is preferred for layer 283, but other materials can also be used, as for example and not intended to be limiting, various semiconductors, metals, alloys, semi-metals, combinations thereof and other conductors. Contacts 23, 25 are conveniently of metal, as that term is used herein. Sidewall spacers 29 are desirably but not essentially provided to laterally separate gate structure 28 from source-drain contacts 23, 25. Field oxide regions 32 in substrate 21 provide isolation laterally outside source-drain regions 22, 24. At the intersection of gate oxide layer 281 and surface 30 of substrate 21 is interface region 34. Useful materials for oxide layer 281 are, for example and not intended to be limiting, $HfO_2$, $ZrO_2$, $TiO_2$, $Al_2O_3$, $SiO_xN_y$ (where x and y indicate the relative oxygen concentrations), $Ta_2O_5$, $SrTiO_3$, $Y_2O_3$, $Sc_2O_3$, $RE_2O_3$, where "RE" stands for any of the rare earth elements, and the corresponding silicates, such as for example and not intended to be limiting, $HfSiO_4$, $ZrSiO_4$, etc., and mixtures of these materials of varying composition. Stated another way, useful materials for layer 281 are oxides of Hf, Zr, Ti, Al, Si, SiN, Ta, SrTi, Y, Sc and RE, and silicates of the preceding elements and compounds, and mixtures thereof. Desirable materials for gate oxide layer 281 are oxides of Hf, Zr, HfZr and mixtures of oxides of Hf and Zr, and mixtures of oxides of Hf and Ti, and mixtures of oxides of Hf and Ta. Preferred materials are oxides of Hf, Zr and HfZr.

First conductor layer 282 is conveniently of oxides of molybdenum-silicon, abbreviated as $MoSi_xO_y$, where "x" indicates the relative amount of silicon and "y" indicates the relative amount of oxygen in the compound. For example and not intended to be limiting, x is desirably in the range of $0 \leq x \leq 0.25$ and y in the range of $0 \leq y \leq 2x+2$. Generally, the smaller the oxygen content, the greater the conductivity, but the lower the effective work function and vice-versa. This combination of materials is suitable for use in P-channel devices where it is desired to have an enhancement mode operation and a comparatively large (e.g., ~5 eV) work function electrode above channel 27. It can also be used in other devices. MoSi-oxide layer 282 is desirably used to separate second conductor layer 283 from gate oxide layer 281. It is desirable that gate oxide layer 281 not undergo adverse chemical reactions with first conductor layer 282 or substrate 21 under typical MOS processing conditions. It is preferable that gate oxide layer 281 comprise a high permittivity (high-k) material (e.g., $k \geq 3.9$), generally the higher the permittivity, the better.

While the above-described device is useful, it has been found that its overall long term stability can be improved by modifying the multi-layered gate structure of FIG. 1 by inserting a mobile ion blocking or absorption layer into the multilayered gate structure. This further improvement is illustrated in FIGS. 2-5. In particular, it is desirable to minimize solid state diffusion of various impurity atoms migrating, as shown by arrows 33 for example, from second conductor layer 283 and/or MoSi-oxide layer 282 into and through layer 281, where they may react with semiconductor substrate 21 in interfacial region 34. In particular, it has been found desirable to block oxygen migration.

Figure 2:
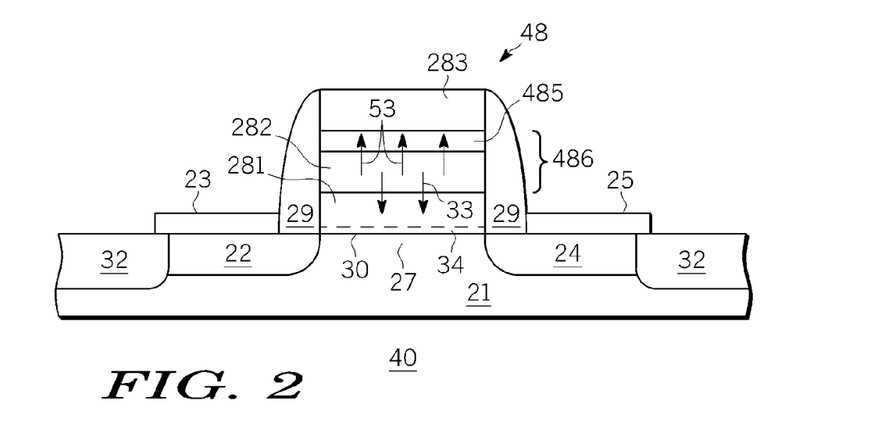
FIG. 2 is a simplified schematic cross-sectional view through a semiconductor device analogous to that of FIG. 1 with a multilayered gate structure, according to another embodiment of the present invention.

FIG. 2 is a simplified schematic cross-sectional view through semiconductor device 40 analogous to that of FIG. 1 and with multilayered gate structure 48, according to another embodiment of the present invention. Like reference numbers are used to identify like regions. Device 40 comprises N-type semiconductor substrate 21 in which are located P-type source region 22 with contact 23 and P-type drain region 24 with contact 25. Source region 22 and drain region 24 are separated at surface 30 by channel region 27. Overlying channel region 27 is multilayer gate structure 48 comprising, in this example, gate oxide layer 281, first conductor layer 282, second conductor layer 283 and impurity absorption layer 485 located between layers 282 and 283. Contacts 23, 25 are conveniently of metal, as that term is used herein. Sidewall spacers 29, desirably but not essentially, laterally separate gate structure 48 from source-drain contacts 23, 25. Field oxide regions 32 provide isolation of device 40 laterally outside source-drain regions 22, 24. At the intersection of first gate oxide layer 281 and surface 30 of substrate 21 is interfacial region 34. Gate oxide layer 281 is conveniently of hafnium oxide, zirconium oxide and/or mixtures thereof with various oxygen concentrations and with thickness in the range about 20 to 100 Angstrom units. First conductor layer 282 is conveniently of molybdenum-silicon-oxide, and with thickness typically in the range of about 50 to 200 Angstrom units. This combination of materials is suitable for use in P-channel devices where it is desired to have an enhancement mode operation and a comparatively large (e.g., ~5 eV) work function electrode above channel 27. Absorption layer 485 is interposed between first conductor layer 282 and second conductor layer 283. Other materials useful for first conductor 282 are conductive oxides of MoSi, NbSi, VSi, ReSi, RuSi, OsSi, RhSi, IrSi, PdSi and oxy-nitrides thereof such as, by way of example and not intended to be limiting, $MoSi_xO_yN_z$, where x, y, z denote the relative concentration of the respective elements that precede these letters.

It has been determined that the stability is improved by inhibiting migration of oxygen (or other reactive impurity atoms) atoms or ions from second conductor layer 283, and/or MoSi-oxide layer 282 into and through gate oxide layer 281 where migrating oxygen or other impurity atoms can react with those of substrate 21 in interfacial region 34. Second conductor layer 283 can be a source of impurities including excess oxygen. By inserting absorption layer 485 between second conductor layer 283 and layer 282, oxygen or other impurity atoms originating in second conductor layer 283 are substantially inhibited or blocked from reaching gate oxide layer 281 and interface region 34. Thus, the long term stability of device 40 is significantly improved. Stated another way, the effect of absorption layer 485 is to place an oxygen (or other impurity) sink in contact with MoSi-oxide layer 282 so that oxygen migration in the direction of arrows 33 is much reduced compared to oxygen migration in the direction of arrows 53. Thus, little if any oxygen (or other impurity) migration occurs in the direction of arrows 33 and overall long term stability is significantly improved. Stated still another way, the presence of absorption or blocking layer 485 can create, for example in this embodiment, an oxygen diffusion gradient in the direction of arrows 53, away from interface region 34. Thus, net migration of oxygen (or other troublesome impurity) will tend to be away from interface region 34. This is highly desirable and, as noted above, can result in significantly improved long term stability of device 40 compared to devices without absorption or blocking layer 485. MoSi is a suitable material for absorption layer 485 but other materials that are conductive, chemically stable in the presence of layers 282 and 283 and that have an affinity for oxygen (or other troublesome impurities) may also be used. It is desirable that layer 485 be substantially stoichiometric (e.g., about 50:50 atomic percent Mo:Si) and have a thickness in the range of about 10 to 300 Angstrom units with about 50 to 200 Angstrom units being preferable. The combination of first conductor (e.g., MoSi-oxide) layer 282 and absorption (e.g., MoSi) layer 485 forms sandwich 486. While MoSi is preferred for absorption layer 485, other material combinations can also be used that have the property of trapping or combining with the troublesome impurity and that are electrically and chemically compatible with first conductor layer 282 and second conductor layer 283. Stated another way, when oxygen is the troublesome impurity, it is desirable that absorption layer 485 have a higher affinity for oxygen than first conductor 282 so that excess oxygen will diffuse away from layer 282 and gate oxide 281. When the troublesome impurity is another element, then it is desirable that absorption layer 485 have a higher affinity for such impurity than first conductor 282, etc. While absorption of oxygen for example in layer 485 will result in some oxygen then being bound up in layer 485, especially if the device is annealed as in some embodiment, the amount of oxygen that becomes bound in layer 485 is generally much less than the oxygen ordinarily present in layer 282 for example, so that layer 485 continues to have a higher oxygen affinity than layer 282 and is distinguishable from layer 282 by its lower oxygen content, or the content of other impurity being blocked or absorbed by layer 485.

Figure 3:
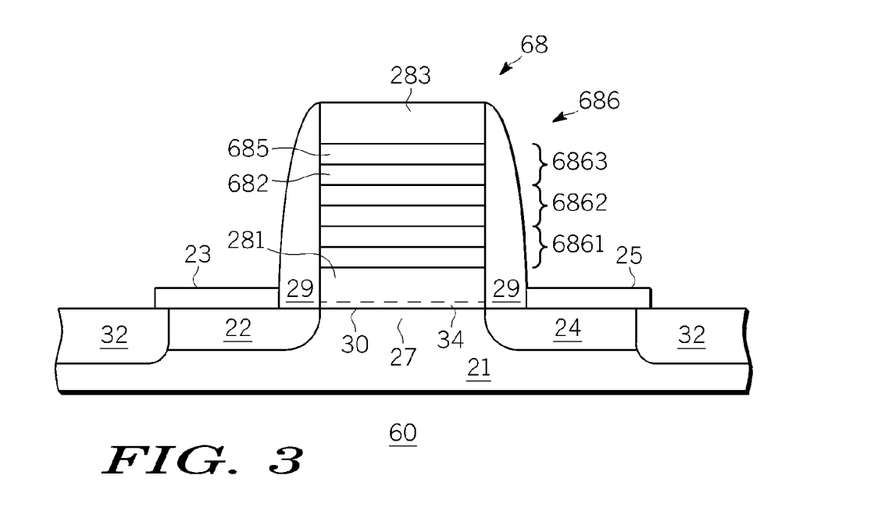
FIG. 3 is a simplified schematic cross-sectional view through a semiconductor device analogous to that of FIG. 2 with a multilayered gate structure, according to yet another embodiment of the present invention.

FIG. 3 is a simplified schematic cross-sectional view through semiconductor device 60 analogous to that of FIG. 2 with multilayered gate structure 68, but according to yet another embodiment of the present invention. Like reference numbers are used to identify like regions. Device 60 comprises N-type semiconductor substrate 21 in which are located P-type source region 22 with contact 23 and P-type drain region 24 with contact 25. Source region 22 and drain region 24 are separated at surface 30 by channel region 27. Overlying channel region 27 is multi-layered gate structure 68 comprising, in this example, gate oxide layer 281 then series 686 of stacked combination layers or sandwiches 6861, 6862, 6863, etc., overlain by second conductor layer 283. Contacts 23, 25 are conveniently of metal, as that term is used herein. Side-wall spacers 29, desirably but not essentially, laterally separate gate structure 68 from source-drain contacts 23, 25. Field oxide regions 32 provide isolation of substrate 21 laterally outside source-drain regions 22, 24. At the intersection of gate oxide layer 281 and surface 30 of substrate 21 is interfacial layer 34. The useful, convenient and preferred materials for gate oxide 281 are described above. Each of combination layer sandwiches 6861, 6862, 6863, etc., in stack 686 is conveniently formed of a sandwich of, e.g., MoSi-oxide, layer 682 (analogous to layer 282) oriented closer to gate oxide layer 281 and overlain by absorption layer 685 (analogous to layer 485) oriented closer to contact 284. The materials suitable for use in layers 282, 682 and for layer 485, 685 are described above and such discussion is incorporated herein by reference. When arranged in sandwiches 6861, 6862, 6863, MoSi-oxide or equivalent layer 682 is desirably about 2-12 atomic layers or approximately 4 to 24 Å thick and more preferable about 2-6 atomic layers (about 4 to 12 Å) thick. MoSi layer 685 is desirably about 2-40 atomic layers thick (about 4 to 80 Å) and more preferably about 8-20 atomic layers (about 16 to 40 Å) thick. Thus, each sandwich 6861, 6862, 6863, etc., in stack 686 has a thickness usefully in the range of about 8 to 104 Å thick and more preferably in the range of about 20 to 64 Å thick. This combination of materials is suitable for use in P-channel devices where it is desired to have an enhancement mode operation and a comparatively large (e.g., ~5 eV) work function electrode above channel 27. While device 40 is shown as comprising one combination layer or sandwich 486 and device 60 is shown as comprising three combination layers or sandwiches 6861, 6862, 6863, this is merely for convenience of illustration and one or more of such sandwiches can be used. The mechanisms by which the structure of device 60 of FIG. 3 inhibits the migration or diffusion of oxygen (or other troublesome impurities) is believed to be substantially the same as that described in connection with device 40 of FIG. 4 and such description is incorporated herein by reference. By providing stack or series 686 of combination layers 6861, 6862, 6863, etc., as in device 60, the overall efficacy in tying up stray oxygen (or other impurity) is improved.

Figure 4:
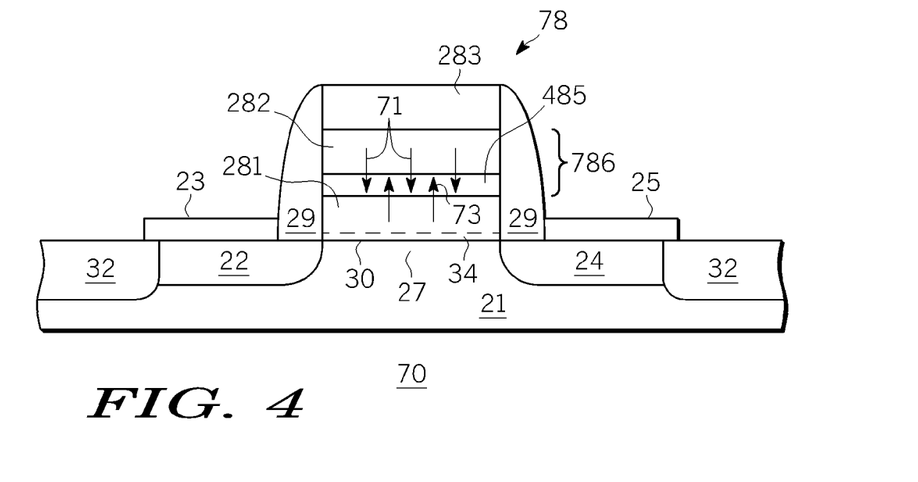
FIG. 4 is a simplified schematic cross-sectional view through a semiconductor device analogous to that of FIG. 2 with a multilayered gate structure, according to a further embodiment of the present invention.

FIG. 4 is a simplified schematic cross-sectional view through MOS device 70 analogous to that of FIG. 2 with multilayered gate structure 78 according to a further embodiment of the present invention. Like reference numbers are used to identify like regions. Device 70 of FIG. 4 is substantially similar to device 40 of FIG. 2, except that the order of layers 282 and 485 in multilayered gate structure 78 is reversed compared to multilayered gate structure 48. That is, in device 70 combination layers or sandwich 786 is flipped over compared to combination layers or sandwich 486 of device 40. In device 70, absorption layer 485 of, for example, MoSi is located between conductive MoSi-oxide layer 282 and gate oxide layer 281, whereas in device 40 it is the other way around. The arrangement of device 70 has the effect of placing oxygen deficient absorption layer 485 between layers 283 and 282 (which may both act as excess oxygen sources) and gate oxide layer 281 with underlying interface region 34. Thus, excess oxygen (or other troublesome impurity) in either layers 283 or 282 and 281 will tend to migrate toward layer 485, as indicated by arrows 71, 73 and away from interface region 34. This has the effect of reducing the adverse effect on the device properties caused by migration of oxygen (or other troublesome impurity) in the multilayer gate stack. The thickness of layers 282 and 485 in device 70 are substantially similar to those in device 40. When absorption layer 485 is located between first conductor layer 282 and gate oxide 281, it is important that it not degrade the effective work function that would otherwise be provided by first conductor 282. In practice this means that layer 485 should desirably have elements in common with first conductor 282, but without oxygen so that it can serve as an effective oxygen sink. For example, where conductor layer 282 comprises MoSi-oxide, then layer 485 preferably comprises MoSi in some proportion, and where layer 282 comprises NbSi-oxide then layer 485 preferably comprises NbSi in some proportion, and so forth. Stated another way, layers 282 and 485 in the arrangement of device 70 should desirably have one or more elements in common other than oxygen.

Figure 5:
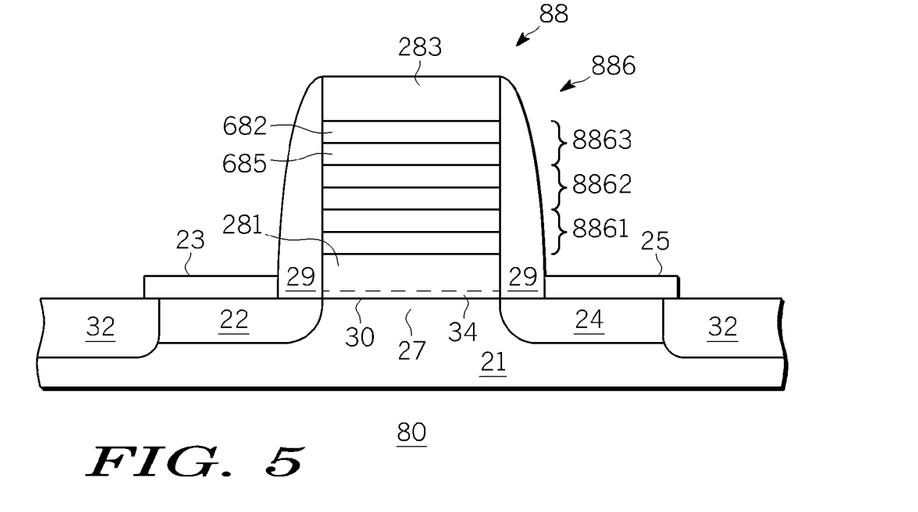
FIG. 5 is a simplified schematic cross-sectional view through a semiconductor device analogous to that of FIG. 3 with a multilayered gate structure, according to a still further embodiment of the present invention.
Figure 6:
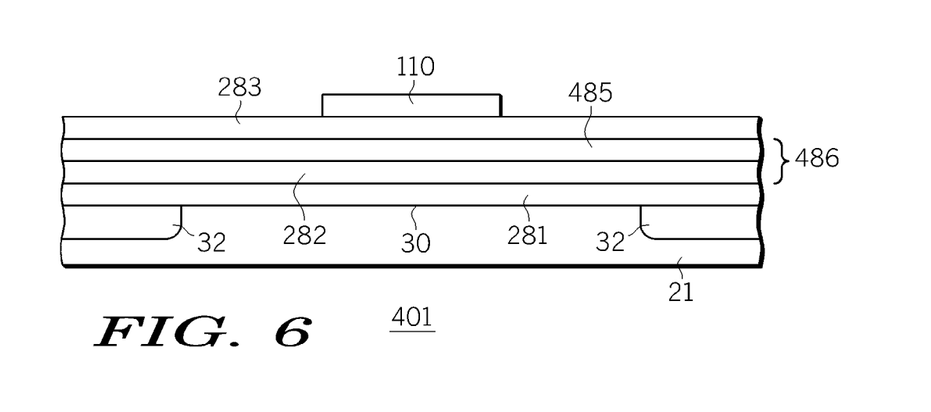
FIGS. 6-11, 12-17, 18-23 and 24-29 show simplified schematic cross-sectional views illustrating sequential steps in methods of fabricating devices of the types illustrated, respectively, in FIGS. 2-5, according to still other embodiments of the present invention.
Figure 7:
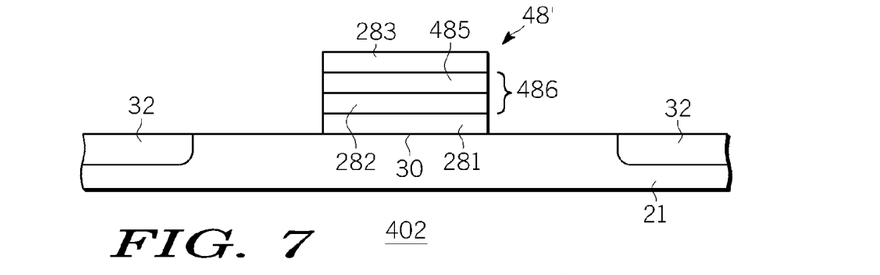
Figure 8:
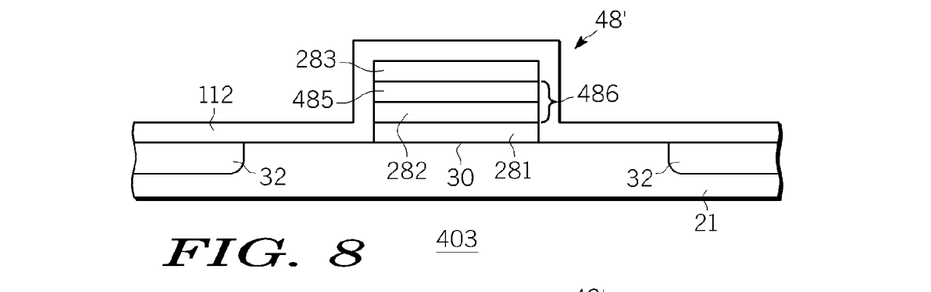
Figure 9:
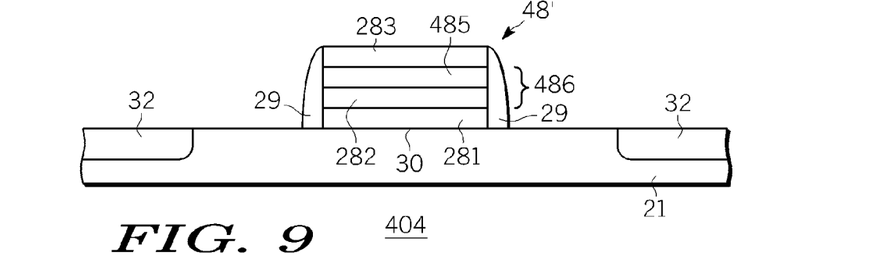
Figure 10:
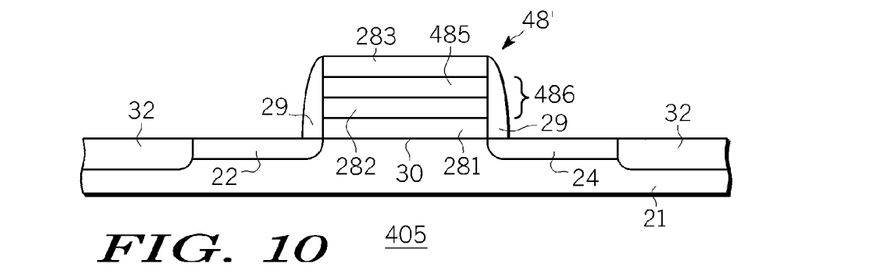
Figure 11:
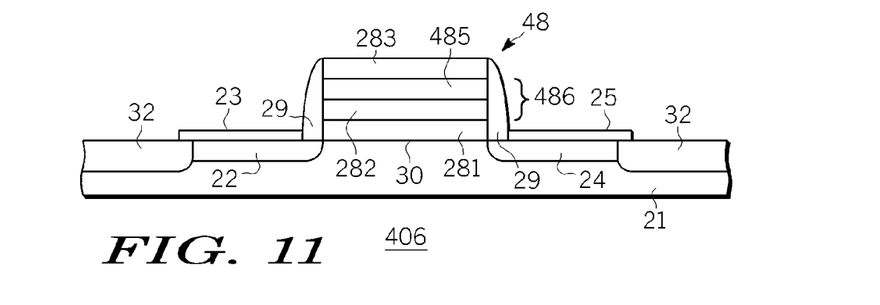
Figure 12:
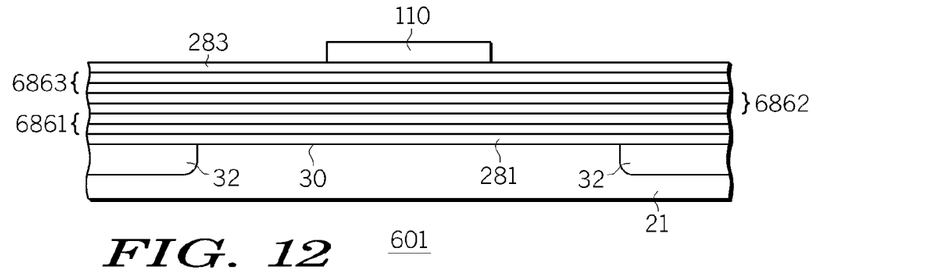
Figure 13:
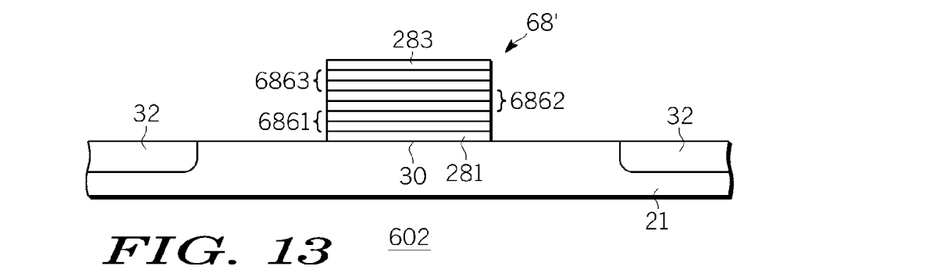
Figure 14:
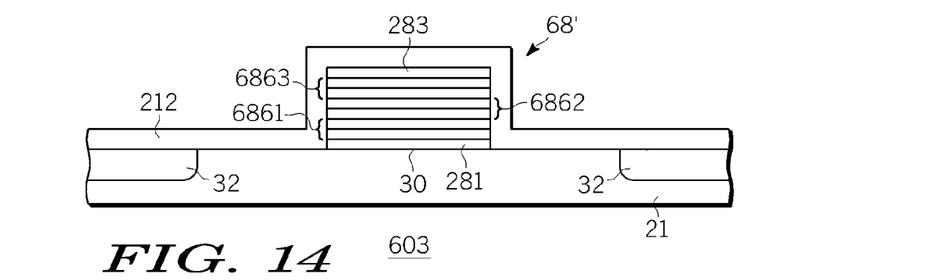
Figure 15:
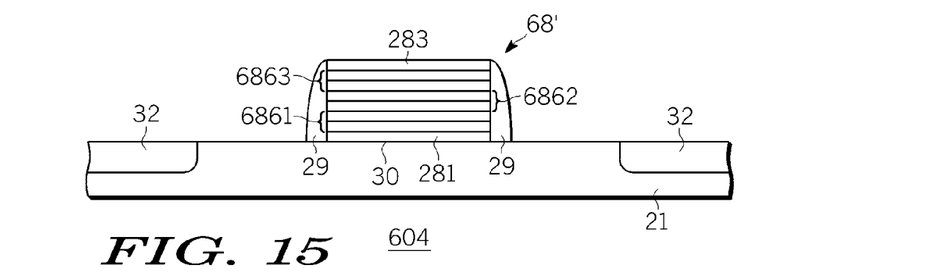
Figure 16:
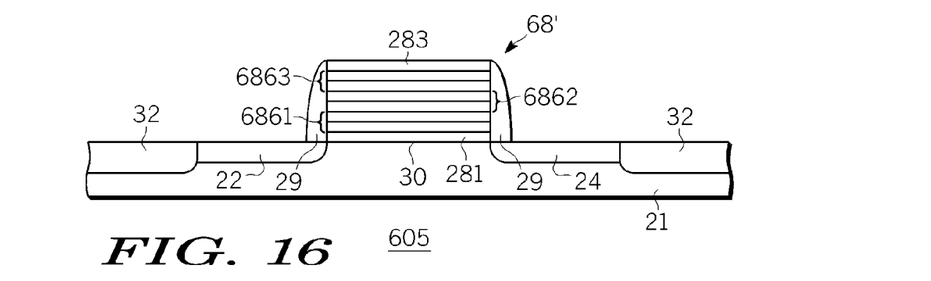
Figure 17:
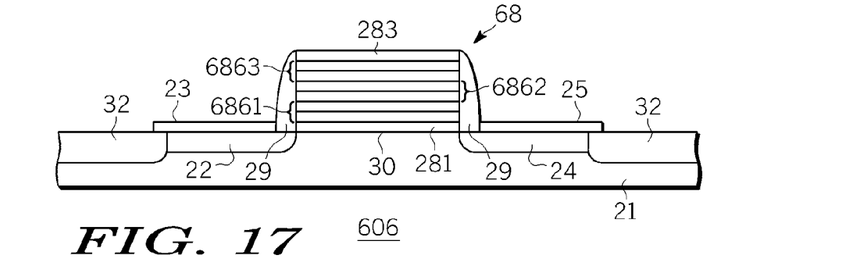
Figure 18:
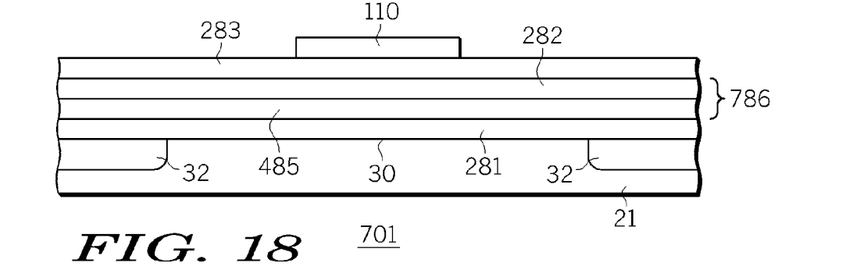
Figure 19:
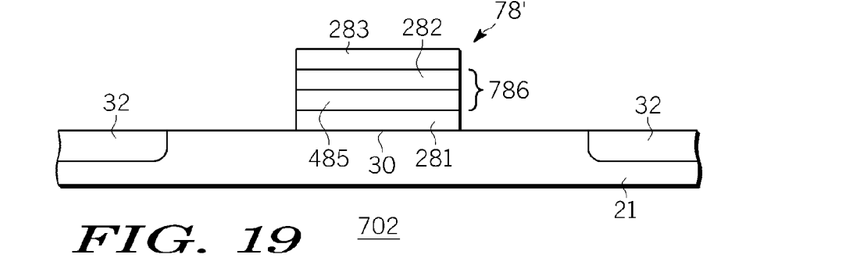
Figure 20:
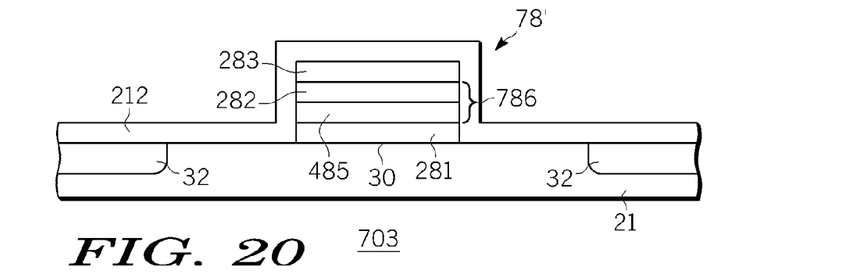
Figure 21:
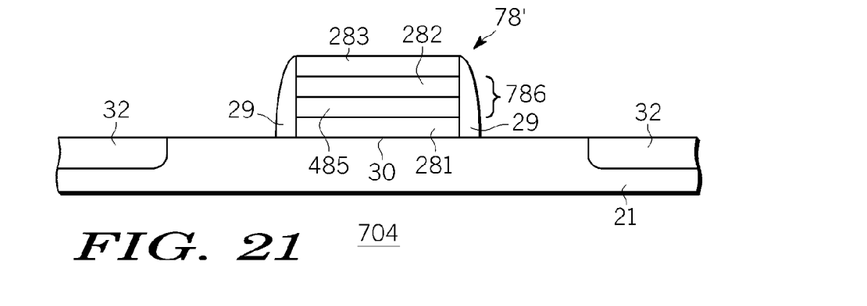
Figure 22:
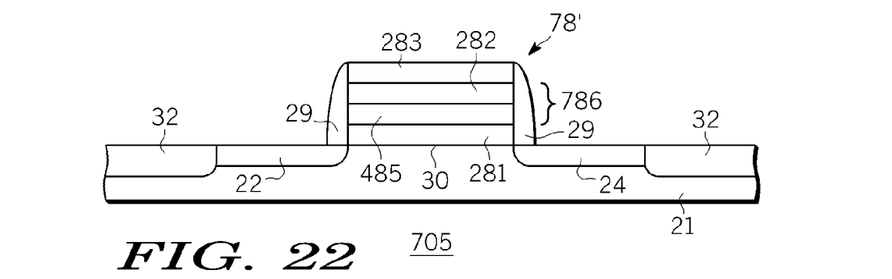
Figure 23:
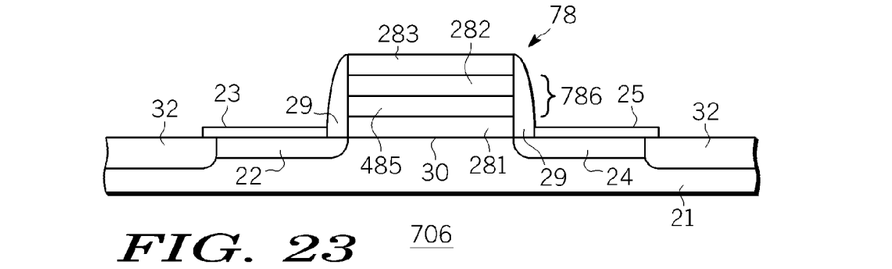
Figure 24:
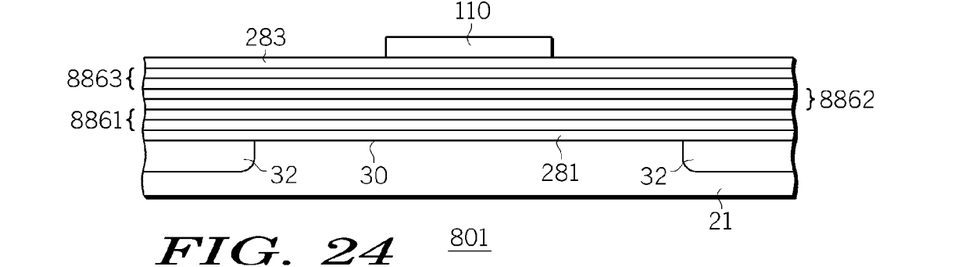
Figure 25:
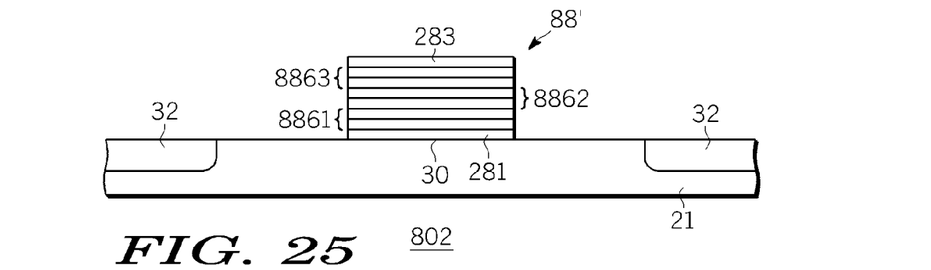
Figure 26:
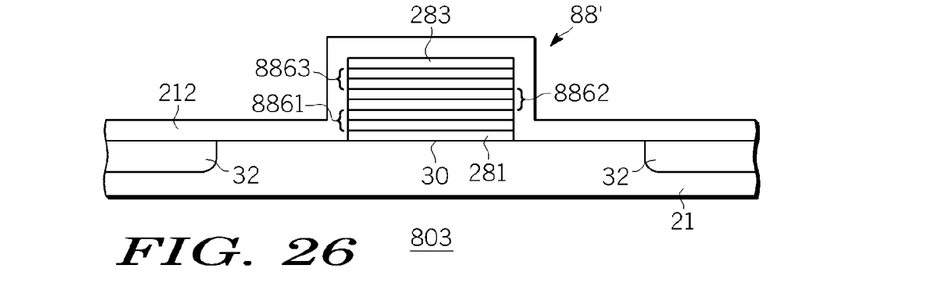
Figure 27:
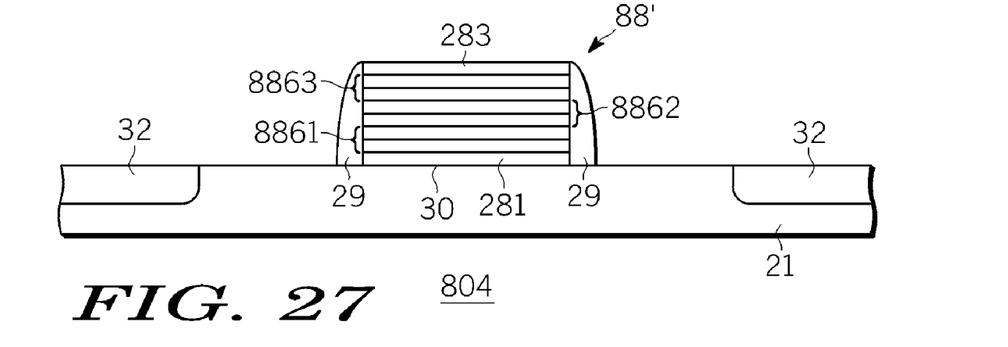
Figure 28:
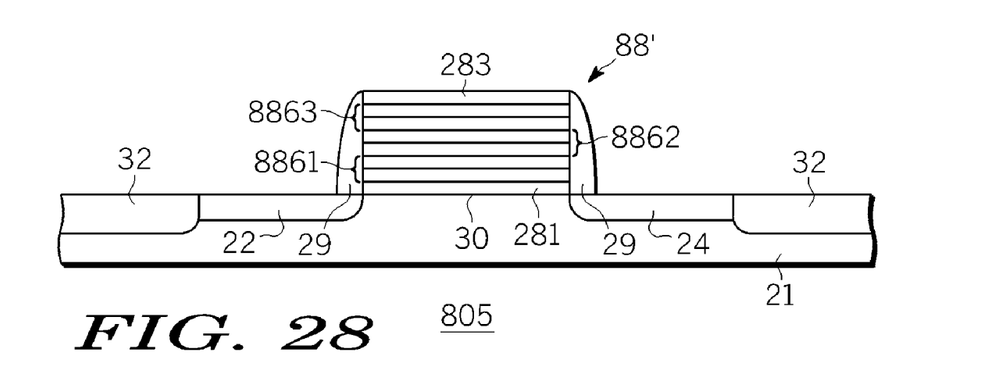
Figure 29:
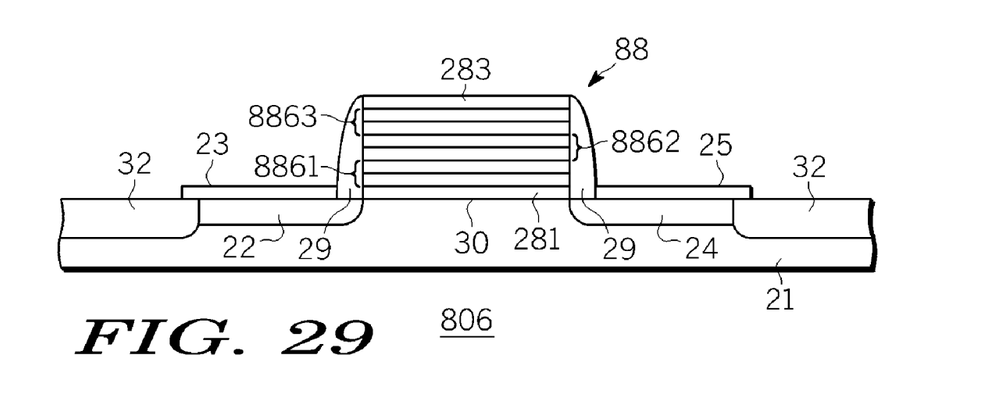

FIG. 5 is a simplified schematic cross-sectional view through MOS device 80 analogous to FIG. 3 with multilayered gate structure 88 according to a still further embodiment of the present invention. Like reference numbers are used to identify like regions. Device 80 of FIG. 5 is substantially similar to device 60 of FIG. 3, except that the order of layers 682 and 685 in multilayered gate structure 88 of device 80 is reversed compared to the order of layer 682 and 685 in multilayered gate structure 68 of device 60. That is, in device 80 combination layers or sandwich 886 is flipped over compared to combination layers or sandwich 686 of device 60. In device 80, absorption layer 685 of, for example MoSi, is located between MoSi$_x$O$_y$ layer 682 and gate oxide layer 281, whereas in device 60 it is the other way around. Like device 60, device 80 employs a series or stack 886 of combination layers or sandwiches 8861, 8862, 8863, etc., analogous to stack 686 of combination layers 6861, 6862, 6863, etc., of device 60. However, in device 80 the order of layer (e.g., MoSi-oxide) 682 and absorption layer (e.g., MoSi) 685 is reversed compared to stack 686 of device 60. Like device 70 of FIG. 4, in each sandwich 8861, 8862, 8863, etc., of device 80, absorption layer 685 is located closer to gate dielectric layer 281 and first conductor layer 682 (e.g., MoSi-oxide) is located closer to second conductor layer 283. The structure of device 80 of FIG. 5 reduces oxygen (or other undesirable impurity) migration toward interface region 34 by substantially the same mechanism as described in connection with device 70 of FIG. 4, except that the efficacy is improved by use of a stack 886 of sandwiches 8861, 8862, 8863, etc. This has the effect of improving the overall long term stability of device 80 compared, for example, to device 20. While the foregoing structures have been described in the context of reducing oxygen migration toward or to interface region 34 for PMOS devices, persons of skill in the art will understand that the same principal of interposing one or more absorption layers between the likely impurity sources and sensitive interfacial regions also applies to other device types and to other impurities besides oxygen that may be troublesome and cause long term drift of device properties. This is accomplished by choosing materials for absorption layers 485, 685 that can act as a sink and/or migration inhibitor for whatever migrating impurity or combination of impurities is the source of instability, so that migration of the troublesome impurity from layers higher up in the stack, or even below it in the stack, into the interfacial region may be inhibited. It should be noted that the impurity migration discussed above cannot be solved in such structures by introducing common blocking materials such as silicon nitride, since such materials are generally insulators. It is important that the absorption layers used in such a multilayered gate stack be conductors. It will be further understood by those of skill in the art, that while interface region 34 is illustrated as being at the semiconductor to gate oxide interface, this is not intended to be limiting, and that the principles taught herein apply to impurity sensitive interface regions that may be located elsewhere in a multilayered gate structure. The principle taught herein of placing an impurity absorption layer between the sensitive interface region and the impurity source and/or creating an impurity diffusion gradient leading away from the sensitive interface region or both, works irrespective of the exact location of the impurity sensitive interface in the multilayered gate. Materials applicable to gate oxide 281, first conductor 282, 682, absorption layer 485, 685 and second conductor layer 283 described above, apply to similarly identified layers or regions in devices 20, 40, 60, 70 and 80, and in FIGS. 6-29.

FIGS. 6-11, 12-17, 18-23 and 24-29 show simplified schematic cross-sectional views illustrating sequential steps 401-406 (collectively method 400), 601-606 (collectively method 600), 701-706 (collectively method 700) and 801-806 (collectively method 800) for fabricating devices 40, 60, 70 and 80, respectively, illustrated in FIGS. 2-5, according to still other embodiments of the present invention. Because there are many similarities, FIGS. 6-11, 12-17, 18-23 and 24-29 and methods 400, 600, 700, 800 are described together. Field oxide (or other dielectric) isolations regions 32 are desirably provided in substrate 21 prior to forming the layers making up gate stacks 48, 68, 78, 88, but this is not essential to the present invention. Methods for providing such field oxide (or other dielectric) regions 32 are well known in the art In initial steps 401, 601, 701, 801 of methods 400, 600, 700, 800, the layers making up multilayered gate stacks 48, 68, 78 and 88 are deposited on surface 30 of substrate 21. The structure of device 20 of FIG. 1 is obtained using method 400 and omitting blocking layer 485.

Referring again to FIGS. 2-5 and 6-29, in step 401 of method 400 of FIGS. 6-11, layers 281, 282, 485 and 283 corresponding to the multilayered gate structure of device 40 of FIG. 2 are grown and/or deposited on surface 30 of substrate 21. In step 601 of method 600 of FIGS. 12-17, layers 281, 6861, 6862, 6863 and 283 corresponding to the multilayer gate structure of device 60 of FIG. 3 are formed. In step 701 of method 700 of FIGS. 18-23, layers 281, 485, 282 and 283 corresponding to the multilayer gate structure of device 70 of FIG. 4 are formed. In step 801 of method 800 of FIGS. 24-29, layers 281, 8861, 8862, 8863 and 283 corresponding to the multilayer gate structure of device 80 of FIG. 5 are formed. These various layers may be formed by chemical vapor deposition (CVD), low pressure chemical vapor deposition (LPCVD), plasma vapor deposition (PVD), plasma enhanced chemical vapor deposition (PECVD), sputtering, evaporation, combinations thereof and other techniques well known in the art. The thicknesses of the various layers are described in connection with the discussion of devices 40, 60, 70, and 80. In addition, mask region 110 of for example, photoresist or electron beam resist is provided on layer 283, to allow the lateral shape and extent of multilayered gate stacks 48, 68, 78 and 88 to be defined in steps 402, 602, 702 and 802, respectively, by for example, chemical etching or other convenient layer removal process, of which many are known in the art. The details of the etching steps will vary for different materials in the various layers that have been chosen by the device designer. Persons of skill in the art will understand how to etch such layers without undue experimentation. For example, and not intended to be limiting, poly-silicon is conveniently removed by anisotropic plasma etching, MoSi is conveniently removed by anisotropic plasma etching, MoSi-oxide is conveniently removed by anisotropic plasma etching, and oxides of Hf, Zr and/or HfZr are conveniently removed by anisotropic plasma etching. For poly etch, HBr based plasma may be used. MoSi may be removed in He/SF$_6$ or Ar/NF$_3$ based plasma, MoSi-oxide may be removed in CF$_4$/O$_2$ or C$_4$F$_8$/O$_2$ plasmas.

In steps 403. 603, 703 and 803 dielectric layer 112, of for example silicon oxide or oxy-nitride or other substantially insulating material, is deposited substantially conformally over gate stacks 48, 68, 78, 88 and the remainder of substrate 21. In steps 404, 604, 704 and 804 an anisotropic etch process is desirably used to remove those portions of layer 112 that are substantially parallel to surface 30 of substrate 21, leaving behind substantially vertical side-wall spacers 29 covering the lateral edges of gate stacks 48, 68, 78, 88. Anisotropic etching is well known in the art and refers to a process wherein the etch rate in a vertical direction (e.g., perpendicular to surface 30 of substrate 21) is higher than the etch rate in a horizontal direction (e.g., substantially parallel to surface 30). Reactive ion etching is a non-limiting example of a suitable technique, but other techniques can also be used. In steps 405, 605, 705 and 805 source-drain doped regions 22, 24 are formed, for example, by ion implantation or thermal doping or other convenient process well known in the art. Field oxide 32 is shown as being formed prior to deposition of the layers making up the gate stacks in step 401, 601, 701, and 801, but this is not intended to be limiting and field oxide 32 may be formed anytime prior to steps 406, 606, 706 and 806. Processes for forming field oxide 32 are well known in the art.

In steps 406, 606, 706, 806 metal contact regions 23, 25 are provided by any convenient technique, as for example, and not intended to be limiting, evaporation, sputtering, CVD, LPCVD, PVD, PECVD or other available processes well known in the art. On completion of steps 406, 606, 706 and 806 device structures 40, 60, 70 and 80 respectively, are obtained. The arrangement and composition of the layers in multilayered gates 48, 68, 78 and 88 described in connection with devices 40, 60, 70 and 80 are provided by methods 400, 600, 700 and 800.

According to a first exemplary embodiment, there is provided an MOS device, comprising, a semiconductor substrate having a principal surface, spaced-apart source and drain regions separated by a channel region at the principal surface, a multilayered gate structure located over the channel region, wherein the multilayered gate structure comprises, a gate dielectric layer in contact with the channel region, a first conductor comprising a metal oxide overlying the gate dielectric layer, a second conductor overlying the first conductor, and an impurity migration inhibiting layer between the gate dielectric layer and the first conductor or between the first conductor and the second conductor. According to a further embodiment, the impurity migration inhibiting layer is adapted to inhibit migration of oxygen. According to a still further embodiment, the impurity migration inhibiting layer and the first conductor comprise the same metal element. According to a yet further embodiment, the gate dielectric layer comprises oxides of one or more of the following: Hf, Zr, Ti, Al, Si, SiN, $Ta_5$, SrTi, $Y_2$, Sc, RE, or comprises corresponding silicates, or comprises mixtures of these materials, and where "RE" stands for any rare earth element. According to a still yet further embodiment, the gate dielectric layer comprises oxides of Hf, Zr or HfZr. According to a yet still further embodiment, the first conductor comprises one or more silicates of Mo, Nb, V, Re, Ru, Os, Rh, Ir, Pd, or nitrides of such silicates. According to another embodiment, the impurity migration inhibiting layer comprises at least one metallic element in common with the first conductor without significant oxygen.

According to a second exemplary embodiment, there is provided an MOS device, comprising, a substrate having therein a source region and a drain region separated by a channel region extending to a first surface of the substrate, a multilayered gate structure located above the channel region and having one or more regions containing a mobile impurity, wherein the gate structure comprises, a gate oxide in substantial contact with the channel region, a first conductor overlying the gate oxide, a second conductor overlying the first conductor, and an impurity absorption layer located above or below the first conductor, adapted to significantly inhibit movement of the mobile impurity. According to a further embodiment, the mobile impurity is oxygen. According to a still further embodiment, the impurity absorption layer is located between the first conductor and the second conductor. According to a yet still further embodiment, the impurity absorption layer is located between the first conductor and the gate oxide. According to another embodiment, the first conductor is divided into first multiple sub-layers and the impurity absorption layer is divided into second multiple sub-layers and the first and second multiple sub-layers are substantially interspersed in pairs. According to a yet another embodiment, the multiple sub-layers are interspersed so that for each pair of interspersed sub-layers, a first sub-layers is closer to the gate oxide and a second sub-layers is closer to the second conductor. According to a still another embodiment, the multiple sub-layers are interspersed so that for each pair of interspersed sub-layers, a second sub-layers is closer to the gate oxide and a first sub-layers is closer to the second conductor. According to a yet still another embodiment, the MOS device is a PMOS device and the gate oxide comprises an oxide of Hf, Zr or HfZr, and the first conductor comprises an oxide of MoSi, and the absorption layer comprises MoSi.

According to a third exemplary embodiment, there is provided a method for forming an MOS device with a multilayered gate structure resistant to migration of a mobile species and overlying a channel region of the device, comprising, providing a semiconductor substrate having an upper surface, forming on the upper surface a stack of overlying layers in various orders, comprising, a gate oxide layer having an interface in contact with the upper surface, a first conductor layer, a second conductor layer, and an absorption layer for reducing migration of the mobile species toward the interface, wherein the absorption layer is formed either after the gate oxide and before the first conductor layer or formed after the first conductor layer and before the second conductor layer, and then removing portions of the stack of layers lying laterally outside a region desired to be the channel region of the device, thereby forming the multi-layered gate structure overlying the channel region of the device. According to a further embodiment, the method further comprises providing spaced-apart doped regions in the semiconductor substrate laterally adjacent the gate structure and communicating with the channel region. According to a yet further embodiment, the method comprises repeating multiple times the steps of first forming the first conductor and then forming the absorption layer so as to provide interspersed pairs of such layers overlying the gate oxide and underlying the second conductor. According to another embodiment, the method further comprises repeating multiple times the steps of first forming the absorption layer and then forming the first conductor so as to provide interspersed pairs of such layers overlying the gate oxide and underlying the second conductor. According to a still another embodiment, the gate oxide comprises hafnium oxide, zirconium oxide and/or mixtures of hafnium and zirconium with oxygen, the first conductor layer comprises molybdenum-silicon-oxide, the second conductor layer comprises poly-Si and the absorption layer comprises molybdenum-silicide.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. For example, various embodiments have been described that are especially useful for inhibiting migration of oxygen within the gate structure of such semiconductor devices, but this is by way of useful example and not intended to be limiting. Persons of skill in the art will understand based on the teachings herein how to choose blocking materials that can inhibit migration of other impurities when arranged as provided in the various illustrative embodiments presented herein. Accordingly, the claimed invention is not intended to be limited merely to combinations for inhibiting oxygen migration but applies to a wide variety of impurities that may be troublesome in such semiconductor devices and such are intended to lie within the scope of the appended claims and their legal equivalents. It should be understood that various changes can be made in the function and arrangement of elements without departing from the scope of the invention as set forth in the appended claims and the legal equivalents thereof.

What is claimed is:

1. A semiconductor device, comprising:
   a semiconductor substrate having a principal surface;
   spaced-apart source and drain regions separated by a channel region at the principal surface;
   a multilayered gate structure located over the channel region, wherein the multilayered gate structure comprises:
      a gate dielectric layer having an interface in contact with the channel region;
      a plurality of stacked combination layers sequentially arranged and overlying the gate dielectric layer, wherein each of the combination layers comprises:
         a first conductor comprising a metal oxide, and
         an impurity migration inhibiting layer comprising a conductive absorption material overlying or underlying the first conductor, and having a higher affinity for oxygen than the first conductor for reducing migration of the mobile species toward the interface; and
      a second conductor overlying the plurality of stacked combination layers.

2. The device of claim 1, wherein the impurity migration inhibiting layer and the first conductor comprise the same metal element.

3. The device of claim 1, wherein the gate dielectric layer comprises oxides of Hf, Zr or HfZr.

4. A semiconductor device, comprising:
   a substrate having therein a source region and a drain region separated by a channel region extending to a first surface of the substrate;
   a multilayered gate structure located above the channel region and having one or more regions containing a mobile impurity, wherein the gate structure comprises:
      a gate oxide having an interface in substantial contact with the channel region;
      a plurality of layers of metal oxide overlying the gate oxide;
      a plurality of impurity migration inhibiting layers, each comprising a conductive absorption material and having a higher affinity for oxygen than the plurality of layers of metal oxide for reducing migration of the mobile species toward the interface, wherein the plurality of impurity migration inhibiting layers are formed overlying the gate oxide and in an alternating arrangement with the plurality of layers of metal oxide; and
      a second conductor overlying the plurality of layers of metal oxide and the plurality of impurity absorption layers.

5. The device of claim 4, wherein a topmost one of the plurality of impurity migration inhibiting layers is located between a topmost one of the plurality of layers of metal oxide and the second conductor.

6. The device of claim 4, wherein a topmost one of the plurality of layers of metal oxide is located between a topmost one of the plurality of impurity migration inhibiting layers and the gate oxide.

7. The device of claim 4, wherein the plurality of layers of metal oxide and the plurality of impurity migration inhibiting layers are arranged in pairs, so that for each pair, a layer of metal oxide is closer to the gate oxide and an impurity migration inhibiting layer is closer to the second conductor.

8. The device of claim 4, wherein the plurality of layers of metal oxide and the plurality of impurity migration inhibiting layers are arranged in pairs, so that for each pair, an impurity migration inhibiting layer is closer to the gate oxide and a layer of metal oxide is closer to the second conductor.

9. The device of claim 4, wherein the MOS device is a PMOS device and the layers of metal oxide comprise an oxide of MoSi and the impurity migration inhibiting layers comprise MoSi.

10. A semiconductor device, comprising:
    a semiconductor substrate having a principal surface;
    spaced-apart source and drain regions separated by a channel region at the principal surface;
    a multilayered gate structure located over the channel region, wherein the multilayered gate structure comprises:
       a gate oxide layer having an interface in contact with the principal surface;
       a first combination of layers overlying the gate oxide layer, which comprises:
          a first conductor layer comprising a metal oxide, and
          a first absorption layer of a conductive absorption material formed in contact with and overlying or underlying the first conductor layer, and having a higher affinity for oxygen than the first conductor layer for reducing migration of the mobile species toward the interface;
       a second combination of layers, overlying the first combination of layers, which comprises:
          a second conductor layer comprising the metal oxide, and
          a second absorption layer comprising the conductive absorption material that is formed in contact with and overlying or underlying the second conductor layer, and in a same relative arrangement as the first conductor layer and the first absorption layer; and
       a third conductor layer overlying the second combination of layers.

11. The device of claim 10, wherein the first and second conductor layers comprise molybdenum-silicon-oxide, the third conductor layer comprises a polycrystalline semiconductor and the first and second absorption layers comprise molybdenum-silicide.

12. The device of claim 10, wherein the gate oxide layer comprises oxides of Hf, Zr or HfZr.

13. The device of claim 10, wherein the first conductor layer comprises one or more silicates of Mo, Nb, V, Re, Ru, Os, Rh, Ir, Pd, or nitrides of such silicates.

14. The device of claim 10, wherein the first absorption layer comprises at least one metallic element in common with the first conductor layer.

15. The device of claim 10, wherein the semiconductor device is a PMOS device and the first conductor layer comprises an oxide of MoSi and the first absorption layer comprises MoSi.

16. The device of claim 10, wherein the third conductor layer comprises a polycrystalline semiconductor, the absorption layer comprises molybdenum-silicide, the gate oxide layer comprises oxides of Hf, Zr or HfZr, and the first conductor layer comprises one or more silicates of Mo, Nb, V, Re, Ru, Os, Rh, Ir, Pd, or nitrides of such silicates.

* * * * *